US007022960B2

(12) United States Patent
Yamamoto et al.

(10) Patent No.: US 7,022,960 B2
(45) Date of Patent: Apr. 4, 2006

(54) PHOTOGRAPHIC FILM IMAGE READING APPARATUS WITH FILM DENSITY DETECTION

(75) Inventors: Hideaki Yamamoto, Hino (JP); Toru Kawabe, Hachioji (JP); Takao Misawa, Hachioji (JP); Masayoshi Ohsato, Hachioji (JP)

(73) Assignee: Konica Corporation, Tokyo (JP)

( * ) Notice: Subject to any disclaimer, the term of this patent is extended or adjusted under 35 U.S.C. 154(b) by 270 days.

(21) Appl. No.: 10/357,149

(22) Filed: Feb. 3, 2003

(65) Prior Publication Data

US 2003/0178550 A1 Sep. 25, 2003

(30) Foreign Application Priority Data

Feb. 12, 2002 (JP) ............................. 2002-033892
Feb. 22, 2002 (JP) ............................. 2002-046907

(51) Int. Cl.
*G01J 1/32* (2006.01)
(52) U.S. Cl. ....................................... 250/205; 362/231
(58) Field of Classification Search ............. 250/208.1, 250/205; 348/223.1, 237, 272, 266; 327/514; 362/16, 18, 231

See application file for complete search history.

(56) References Cited

U.S. PATENT DOCUMENTS 5,563,656 A * 10/1996 Kyuma ........................ 348/234
6,043,476 A * 3/2000 Tsai ............................. 250/205
6,058,202 A * 5/2000 Yamaguchi .................. 382/112
6,127,783 A * 10/2000 Pashley et al. ............. 315/149
6,222,172 B1 * 4/2001 Fossum et al. ............. 250/205
6,421,083 B1 * 7/2002 Takakura .................. 348/223.1
6,560,256 B1 * 5/2003 Seki et al. ................. 372/38.02
6,617,559 B1 * 9/2003 Emery et al. ............... 250/205
6,621,519 B1 * 9/2003 Nakayama et al. ....... 348/223.1
6,674,060 B1 * 1/2004 Antila ......................... 250/205
6,727,974 B1 * 4/2004 Nishikawa .................... 355/41
6,753,984 B1 * 6/2004 Wada ........................... 358/475
6,850,272 B1 * 2/2005 Terashita ................... 348/223.1
6,870,567 B1 * 3/2005 Funston et al. .......... 348/333.04
2001/0007470 A1 * 7/2001 Haavisto ..................... 348/223
2002/0191102 A1 * 12/2002 Yuyama et al. ............. 348/370

* cited by examiner

*Primary Examiner*—David Porta
*Assistant Examiner*—Davienne Monbleau
(74) *Attorney, Agent, or Firm*—Frishauf, Holtz, Goodman & Chick, P.C.

(57) ABSTRACT

There is described an image reading apparatus that reads image information from a document, such as a negative film, a photographic prints, etc., on which image information is recorded. The image-apparatus includes a plurality of light sources for emitting lights, wavelengths of which are different relative to each other; an image-reading section to read the image by detecting either transmitted lights or reflected lights, which are obtained by irradiating the lights emitted from the plurality of light sources onto the image recorded on a document; and a light-amount adjusting section to independently adjust each amount of the lights emitted by the plurality of light sources, when the image-reading section reads the image.

25 Claims, 9 Drawing Sheets

PHOTOGRAPHIC FILM IMAGE READING APPARATUS WITH FILM DENSITY DETECTION

TECHNICAL FIELD OF THE INVENTION

The present invention relates to an image reading apparatus and a control method for the image reading apparatus, and in particular, to an image reading apparatus that reads image information from a document, such as a negative film, a photographic print, etc., on which image information is recorded.

BACKGROUND OF THE INVENTION

There has lately been known an image reading apparatus that reads digitally an image recorded on a photographic film by the use of a reading sensor such as CCD (Charge Coupled Device). On the image reading apparatus of this kind, light is projected on a photographic film on which an image is recorded, and its transmitted light is read photoelectrically by a CCD line sensor, and thereby, the image thus read is subjected to digital conversion to obtain digital image data. In general, a halogen lamp is used as a light source by which a photographic film is irradiated with light.

Further, a photographic image processing system that converts an image obtained through photographing by a camera into digital image data is proposed and is put to practical use. In this system, there is used an image processing apparatus in which a document such as a negative film obtained through photographing by a camera is read by a film scanner (image reading section), and is converted into digital image data to be recorded.

On the film scanner (image reading section) constituting the image processing apparatus, there is provided a light-emitting mechanism that projects prescribed light on a document. The light that is emitted from this light-emitting mechanism and is transmitted through the document or reflected on the document is received by a light-receiving means such as CCD, and is read as image information.

However, in the image reading apparatus that employs a halogen lamp mentioned above as a light source, there has been a problem that colors of images read are ill balanced, because a color balance of a light source cannot be controlled. For example, as shown in FIG. 7, a color balance of images read is lost because an amount of transmitted light on a negative film base (non-image area) differs depending on wavelengths, namely, on colors (R, G and B).

On the other hand, there is proposed a light-emitting mechanism equipped with a prescribed light source and a light-converging means for converging light emitted from the light source. In the past, a halogen lamp was used as a light source. However, it was impossible to irradiate a document with light that is well balanced from the short wavelength side to the long wavelength side, because spectral component of the light that is emitted from the halogen lamp was biased to the long wavelength side. Therefore, output of accurate image information was disturbed.

Further, a decline and unevenness of an amount of light emitted from the light source were unavoidable under the condition of only light-converging means equipped on the conventional light-emitting mechanism, resulting in occasional deterioration of image quality of the image read.

DISCLOSURE OF THE INVENTION

To overcome the abovementioned drawbacks, it is a first object of the present invention to improve an image quality of the read image by employing LED (Light Emitting Diode) as a light source of the image-reading apparatus and by controlling a color balance and distribution of light amount of the LED light source.

Further, it is a second object of the present invention to provide an image-reading apparatus, which includes a light source, emitting light uniformly distributed from a short wavelength side to a long wavelength side, and a light emitting mechanism capable of preventing reduction and unevenness of an amount of light emitted form the light source, and thereby, makes it possible to improve the image quality of the read image.

Accordingly, to overcome the cited shortcomings, the abovementioned objects of the present invention can be attained by image-reading apparatus and image-reading methods described as follow.

(1) An apparatus for reading an image, the apparatus comprising: a plurality of light sources for emitting lights, wavelengths of which are different relative to each other; an image-reading section to read the image by detecting either transmitted lights or reflected lights, which are obtained by irradiating the lights emitted from the plurality of light sources onto the image recorded on a document; and a light-amount adjusting section to independently adjust each amount of the lights emitted by the plurality of light sources, when the image-reading section reads the image.

(2) The apparatus of item 1, wherein each of the light sources is further divided into a plurality of blocks, and the light-amount adjusting section adjusts each amount of lights for every block, included in the blocks.

(3) The apparatus of item 1, further comprising: a density-information detecting section to detect density-information of the document; wherein the light-amount adjusting section independently adjusts each amount of the lights emitted by the plurality of light sources, based on the density-information of the document detected by the density-information detecting section.

(4) The apparatus of item 3, wherein the document is a photographic film, and the density-information, detected by the density-information detecting section, is a base density of the photographic film.

(5) The apparatus of item 2, further comprising: a shading-information detecting section to detect shading-information in respect to each of the light sources; wherein the light-amount adjusting section adjusts each amount of lights for every block, included in the blocks, based on the shading-information detected by the shading-information detecting section.

(6) The apparatus of item 1, further comprising: an electronic-current controlling section to control each of light emitting actions of the light sources by controlling each of electronic currents to be supplied to each of the light sources, according to each amount of the lights adjusted by the light-amount adjusting section.

(7) The apparatus of item 1, further comprising: a pulse-width-modulation controlling section to control each of light emitting actions of the light sources by employing a pulse-width modulating method, in which a storing time of a light-receiving element, receiving a light coming from the document, is defined as one period, according to each amount of the lights adjusted by the light-amount adjusting section.

(8) The apparatus of item 7, wherein the pulse-width-modulation controlling section controls an output of the light-receiving element by changing the storing time of the light-receiving element.

(9) The apparatus of item 1, further comprising: a standby light-amount adjusting section to adjust each amount of the lights emitted by the plurality of light sources during a standby state other than an operating state for reading the document.

(10) A method for controlling an method, having a plurality of light sources for emitting lights, wavelengths of which are different relative to each other, to read an image, the method comprising the steps of: irradiating the lights emitted from the plurality of light sources onto the image recorded on a document; reading the image by detecting either transmitted lights or reflected lights, which are obtained from the document; and independently adjusting each amount of the lights, emitted by the plurality of light sources, when reading the image.

(11) The method of item 10, wherein each of the light sources is further divided into a plurality of blocks, and each amount of lights is adjusted for every block, included in the blocks, in the adjusting step.

(12) The method of item 10, further comprising the step of: detecting density-information of the document; wherein, in the adjusting step, each amount of the lights emitted by the plurality of light sources is independently adjusted, based on the density-information of the document detected in the detecting step.

(13) The method of item 12, wherein the document is a photographic film, and the density-information, detected in the detecting step, is a base density of the photographic film.

(14) The method of item 11, further comprising the step of: detecting shading-information in respect to each of the light sources; wherein, in the adjusting step, each amount of lights is independently adjusted for every block, included in the blocks, based on the shading-information detected in the detecting step.

(15) The method of item 10, further comprising the step of: controlling each of light emitting actions of the light sources by controlling each of electronic currents to be supplied to each of the light sources, according to each amount of the lights adjusted in the adjusting step.

(16) The method of item 10, further comprising the step of: controlling each of light emitting actions of the light sources by employing a pulse-width modulating method, in which a storing time of a light-receiving element, receiving a light coming from the document, is defined as one period, according to each amount of the lights adjusted in the adjusting step.

(17) The method of item 16, wherein, in the controlling step, an output of the light-receiving element is controled by changing the storing time of the light-receiving element.

(18) The method of item 10, further comprising the step of: adjusting each amount of the lights emitted by the plurality of light sources during a standby state other than an operating state for reading the document.

(19) An apparatus for reading an image, the apparatus comprising: a light-emitting section to irradiate light onto a document on which the image is recorded; and an image-reading section to read the image by detecting either transmitted light or reflected light, which are obtained by irradiating the light emitted from the light-emitting section onto the image recorded on the document; wherein the light-emitting section includes: a plurality of light sources; a light-mixing device to mix lights emitted from the plurality of light sources, so as to form an emitting light, which includes the lights traveling in substantially a same direction; and a light-converging element to converge the emitting light, mixed by the light-mixing device, onto the document.

(20) The apparatus of item 19, wherein the plurality of light sources emit the lights, wavelengths of which are different relative to each other; and wherein the light-mixing device is such a wavelength-selective optical member that selectively transmits or reflects the lights in response to the wavelengths of the lights.

(21) The apparatus of item 19, wherein each of directivity angles of the light sources is set at an angle in a range of 10°–40°.

(22) The apparatus of item 19, wherein, in each of the light sources, a plurality of light-emitting elements are arranged in a honeycomb pattern.

(23) The apparatus of item 19, wherein the light-emitting section further includes: a light-guiding member to guide the emitting light, formed by the light-mixing device, to the light-converging element.

(24) The apparatus of item 23, wherein the light-guiding member has a light-diffusing member.

(25) The apparatus of item 23, wherein the light-guiding member has a plate-type optical element for converging light.

(26) The apparatus of item 25, wherein the plate-type optical element is a Fresnel lens.

(27) The apparatus of item 19, wherein the light-converging element is a rod lens.

(28) The apparatus of item 27, wherein a distance between a light-emitting surface of the rod lens and the document is equal to or greater than 5 mm, and equal to or smaller than twice a diameter of the rod lens.

(29) An apparatus for reading an image, the apparatus comprising: a light-emitting section to irradiate light onto a document on which the image is recorded; an image-reading section to read the image by detecting either transmitted light or reflected light, which are obtained by irradiating the light emitted from the light-emitting section onto the image recorded on the document; and a light-amount adjusting section to adjust amount of the light irradiated from the light-emitting section, when the image-reading section reads the image of the document; wherein the light-emitting section includes: a plurality of light sources that emit lights, wavelengths of which are different relative to each other; a light-mixing device to mix the lights emitted from the plurality of light sources, so as to form an emitting light, which includes the lights traveling in substantially a same direction; and a light-converging element to converge the emitting light, mixed by the light-mixing device, onto the document; and wherein the light-amount adjusting section independently adjust each amount of the lights emitted by the plurality of light sources.

Further, to overcome the abovementioned problems, other image-reading apparatus and image-reading methods, embodied in the present invention, will be described as follow:

(30) An image-reading apparatus characterized by comprising:

a plurality of light sources, which emit lights for reading a document, wavelengths of said lights being different to each other; and light-amount adjusting means for independently adjusting each amount of the lights emitted by the plurality of light sources, when reading the image of the document.

(31) The image-reading apparatus, described in item 30, characterized in that each of the light sources is divided into a plurality of blocks, and the light-amount adjusting means adjusts each amount of lights for every block.

(32) The image-reading apparatus, described in item 30, characterized by further comprising:

density-information detecting means for detecting density-information of the document; and, characterized in that the light-amount adjusting means independently adjusts each amount of the lights emitted by the plurality of light sources, based on the density-information of the document detected by the density-information detecting means.

(33) The image-reading apparatus, described in item 32, characterized in that the document is a photographic film, and the density-information, detected by the density-information detecting means, is a base density of the photographic film.

(34) The image-reading apparatus, described in item 31, characterized by further comprising:

shading-information detecting means for detecting shading-information in respect to each of the light sources; and, characterized in that the light-amount adjusting means adjusts each amount of lights for every block, based on the shading-information detected by the shading-information detecting means.

(35) The image-reading apparatus, described in anyone of items 30–34, characterized by further comprising:

electronic-current controlling means for controlling each of light emitting actions of the plurality of light sources by controlling each of electronic currents to be supplied to each of the light sources, according to each amount of the lights adjusted by the light-amount adjusting means.

(36) The image-reading apparatus, described in anyone of items 30–35, characterized by further comprising:

pulse-width-modulation controlling means for controlling each of light emitting actions of the light sources by employing a pulse-width modulating method, in which a storing time of a light-receiving element, receiving a light coming from the document, is defined as one period, according to each amount of the lights adjusted by the light-amount adjusting means.

(37) The image-reading apparatus, described in item 36, characterized in that the pulse-width-modulation controlling means further controls an output of the light-receiving element by changing the storing time of the light-receiving element.

(38) The image-reading apparatus, described in anyone of items 30–37, characterized by further comprising:

standby light-amount adjusting means for adjusting each amount of the lights emitted by the plurality of light sources during a standby state other than an operating state for reading the document.

(39) A controlling method of image-reading apparatus, characterized in that the image-reading apparatus comprises a plurality of light sources, which emit lights for reading a document, wavelengths of said lights being different to each other, and the controlling method comprises a light-amount adjusting process for independently adjusting each amount of the lights emitted by the plurality of light sources, when reading the image of the document.

(40) The controlling method of image-reading apparatus, described in item 39, characterized in that each of the light sources is divided into a plurality of blocks, and the light-amount adjusting means adjusts each amount of lights for every block.

(41) The controlling method of image-reading apparatus, described in item 39, characterized by further comprising:

a density-information detecting process for detecting density-information of the document; and, characterized in that the light-amount adjusting process independently adjusts each amount of the lights emitted by the plurality of light sources, based on the density-information of the document detected by the density-information detecting process.

(42) The controlling method of image-reading apparatus, described in item 39, characterized in that the document is a photographic film, and the density-information, detected by the density-information detecting process, is a base density of the photographic film.

(43) The controlling method of image-reading apparatus, described in item 40, characterized by further comprising:

a shading-information detecting process for detecting shading-information in respect to each of the light sources; and, characterized in that the light-amount adjusting process adjusts each amount of lights for every block, based on the shading-information detected by the shading-information detecting process.

(44) The controlling method of image-reading apparatus, described in anyone of items 39–43, characterized by further comprising:

an electronic-current controlling process for controlling each of light emitting actions of the plurality of light sources by controlling each of electronic currents to be supplied to each of the light sources, according to each amount of the lights adjusted by the light-amount adjusting means.

(45) The controlling method of image-reading apparatus, described in anyone of items 39–44, characterized by further comprising:

a pulse-width-modulation controlling process for controlling each of light emitting actions of the light sources by employing a pulse-width modulating method, in which a storing time of a light-receiving element, receiving a light coming from the document, is defined as one period, according to each amount of the lights adjusted by the light-amount adjusting process.

(46) The controlling method of image-reading apparatus, described in item 45, characterized in that the pulse-widthmodulation controlling process further controls an output of the light-receiving element by changing the storing time of the light-receiving element.

(47) The controlling method of image-reading apparatus, described in anyone of items 39–46, characterized by further comprising:
a standby light-amount adjusting process for adjusting each amount of the lights emitted by the plurality of light sources during a standby state other than an operating state for reading the document.

(48) An image-reading apparatus, characterized in that
in the image-reading apparatus, which comprises a light-emitting mechanism and a reading means for reading a predetermined image information by detecting either transmitted light or reflected light, which are obtained by irradiating the light emitted from the light-emitting mechanism onto the document on which the predetermined image information is recorded,
the light-emitting mechanism includes:
a plurality of light sources;
light-mixing means for mixing lights emitted from the plurality of light sources, so as to form an emitting light, which includes the lights traveling in substantially a same direction; and
light-converging means for converging the emitting light, mixed by the light-mixing means, onto the document.

(49) The image-reading apparatus, described in item 48, characterized in that the plurality of light sources emit the lights, wavelengths of which are different relative to each other, and the light-mixing means is such a wavelength-selective optical member that selectively transmits or reflects the lights in response to the wavelengths of the lights.

(50) The image-reading apparatus, described in item 48 or 49, characterized in that each of directivity angles of the light sources is set at an angle in a range of 10°–40°.

(51) The image-reading apparatus, described in anyone of items 48–50, characterized in that, in each of the light sources, a plurality of light-emitting elements are arranged in a honeycomb pattern.

(52) The image-reading apparatus, described in anyone of items 48–51, characterized by further comprising:
light-guiding means for guiding the light, mixed by the light-mixing means, to the light-converging element.

(53) The image-reading apparatus, described in item 52, characterized in that the light-guiding means has light-diffusing means.

(54) The image-reading apparatus, described in item 52 or 53, characterized in that the light-guiding means has a plate-type optical element for converging light

(55) The image-reading apparatus, described in item 52 or 53, characterized in that the plate-type optical element is a Fresnel lens.

(56) The image-reading apparatus, described in anyone of items 48–55, characterized in that the light-converging element is a rod lens.

(57) The image-reading apparatus, described in item 56, characterized in that a distance between a light-emitting surface of the rod lens and the document is equal to or greater than 5 mm, and equal to or smaller than twice a diameter of the rod lens.

Figure 4:
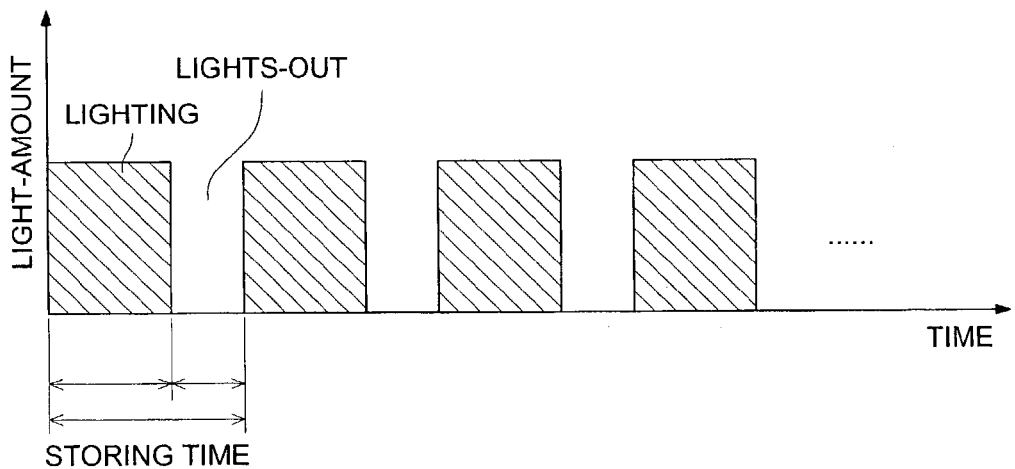
Figure 4:
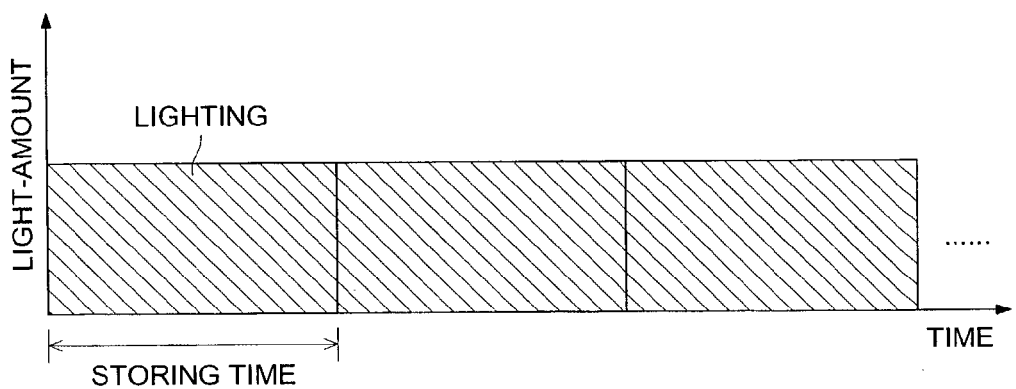

Each of FIG. 4(*a*) and FIG. 4(*b*) is a diagram showing a light intensity adjusting method by PWM control.

Figure 5:
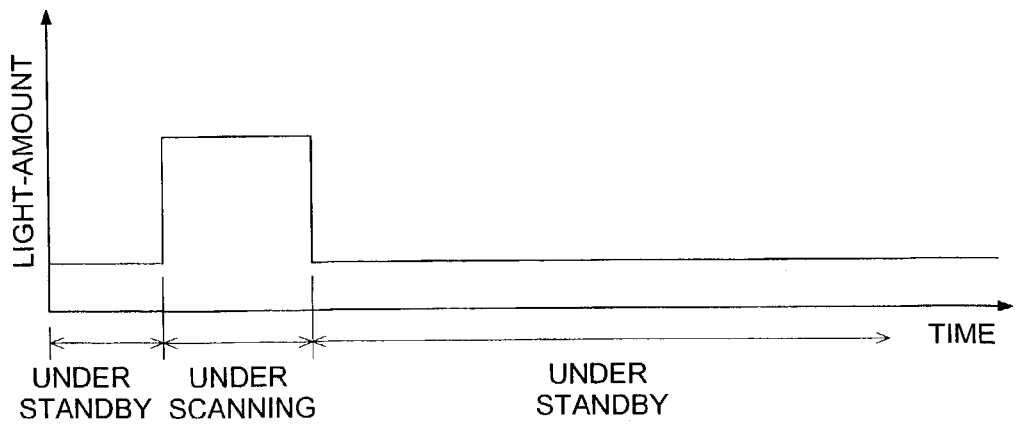

FIG. 5 is a diagram showing a light-amount level under film image scanning and under standby.

Figure 6:
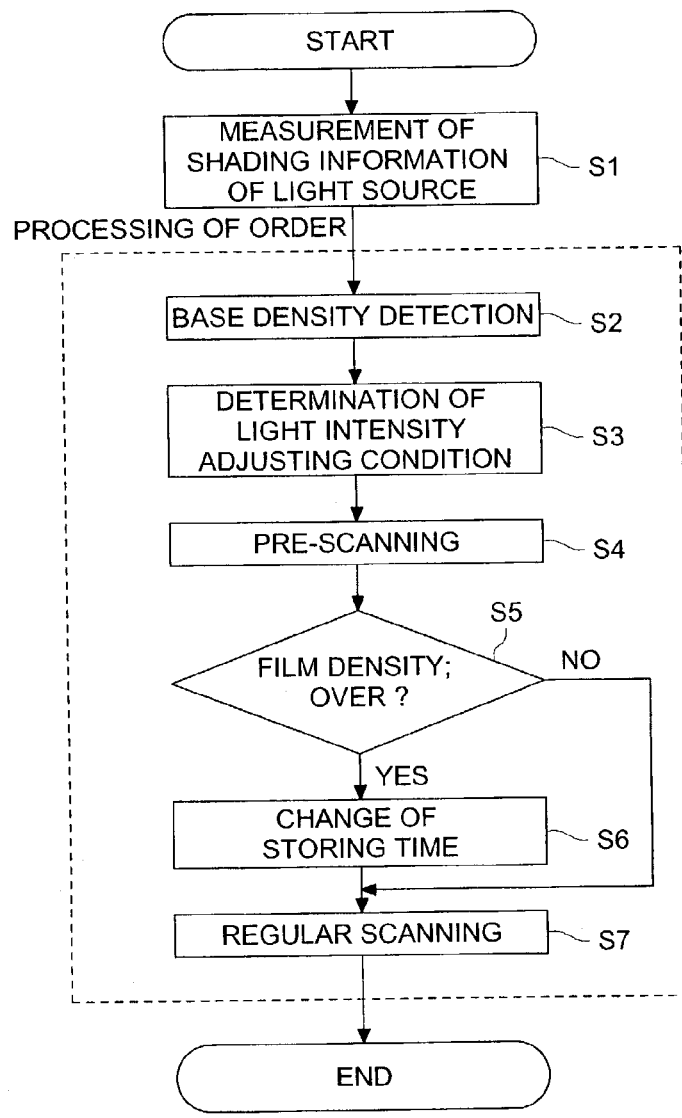

FIG. 6 is a flow chart showing image reading processing conducted by image reading apparatus 200.

Figure 7:
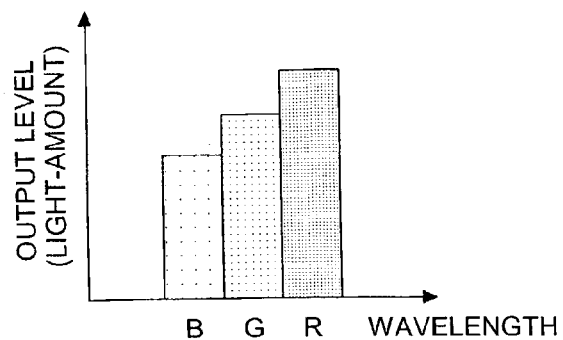

FIG. 7 is a diagram showing an amount of light transmitted through the negative film base (output level).

Figure 8:
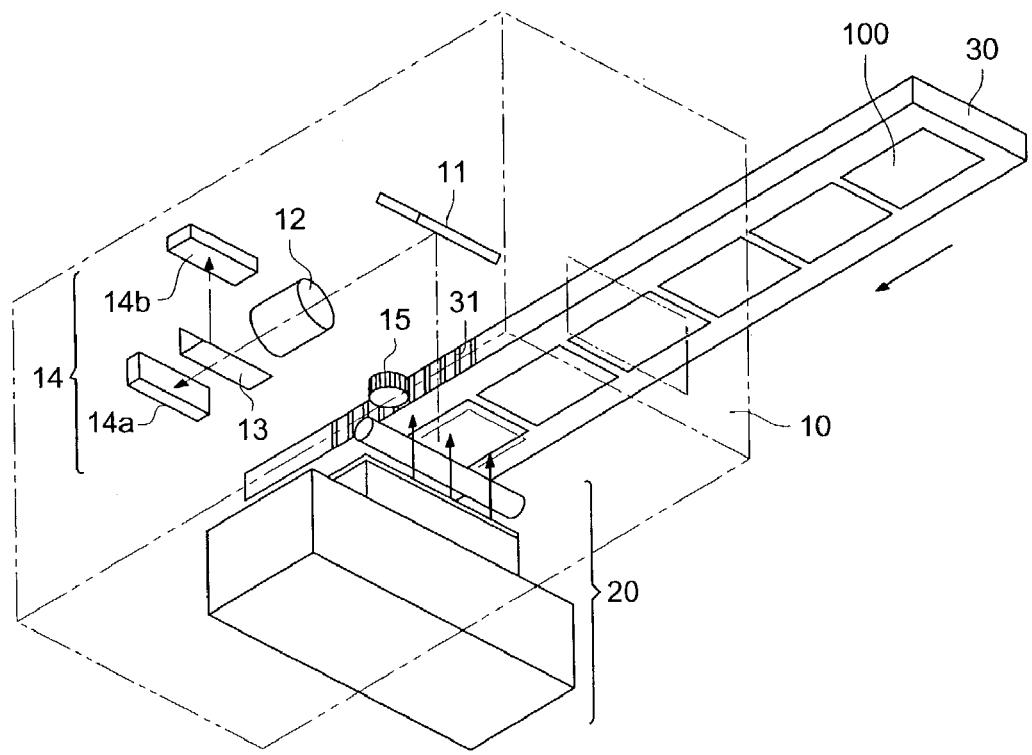

FIG. 8 is a schematic perspective view showing a film scanner of an image reading apparatus serving as a second embodiment to which the invention is applied.

Figure 9:
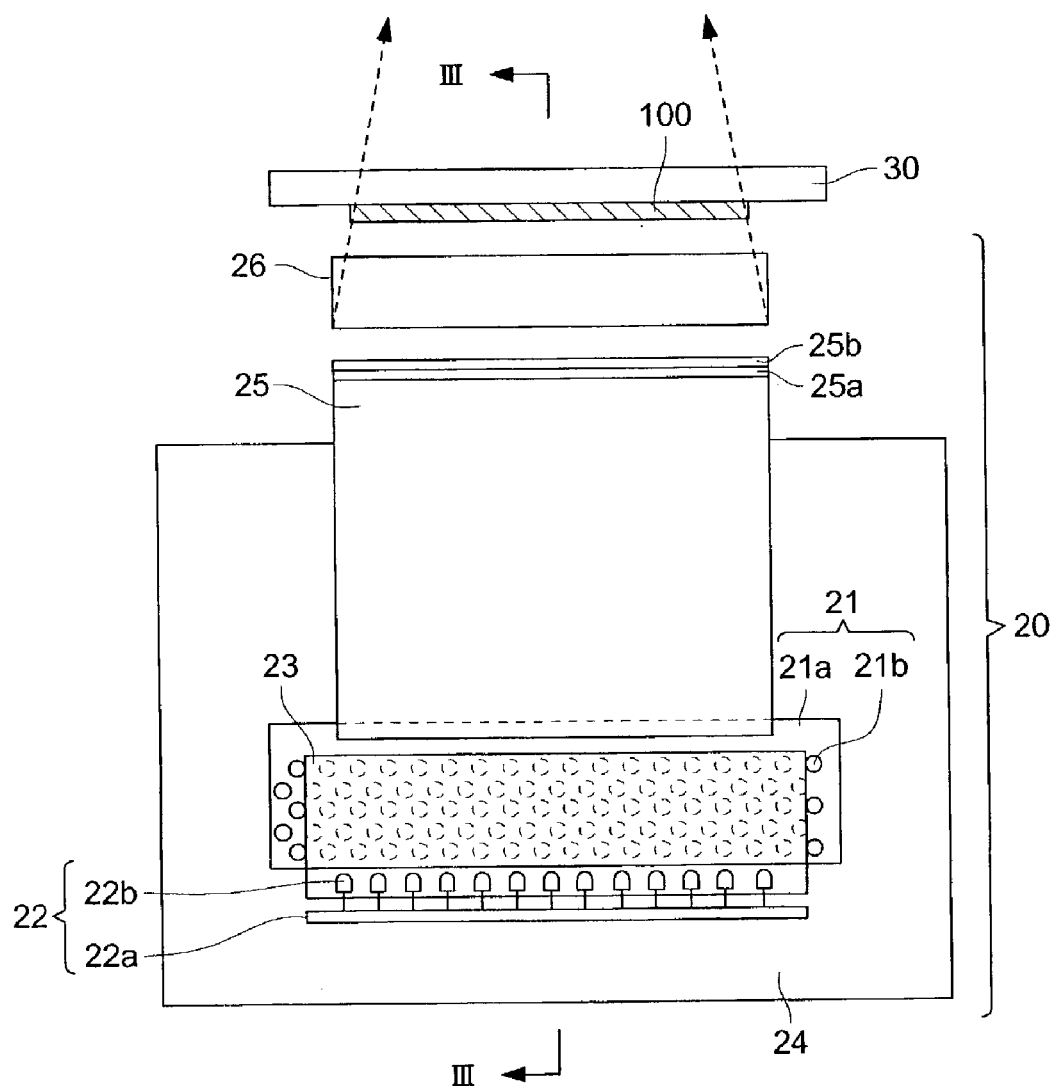

FIG. 9 is an illustration for illustrating a mechanical structure of a light-emitting mechanism housed in the film scanner shown in FIG. 8.

Figure 10:
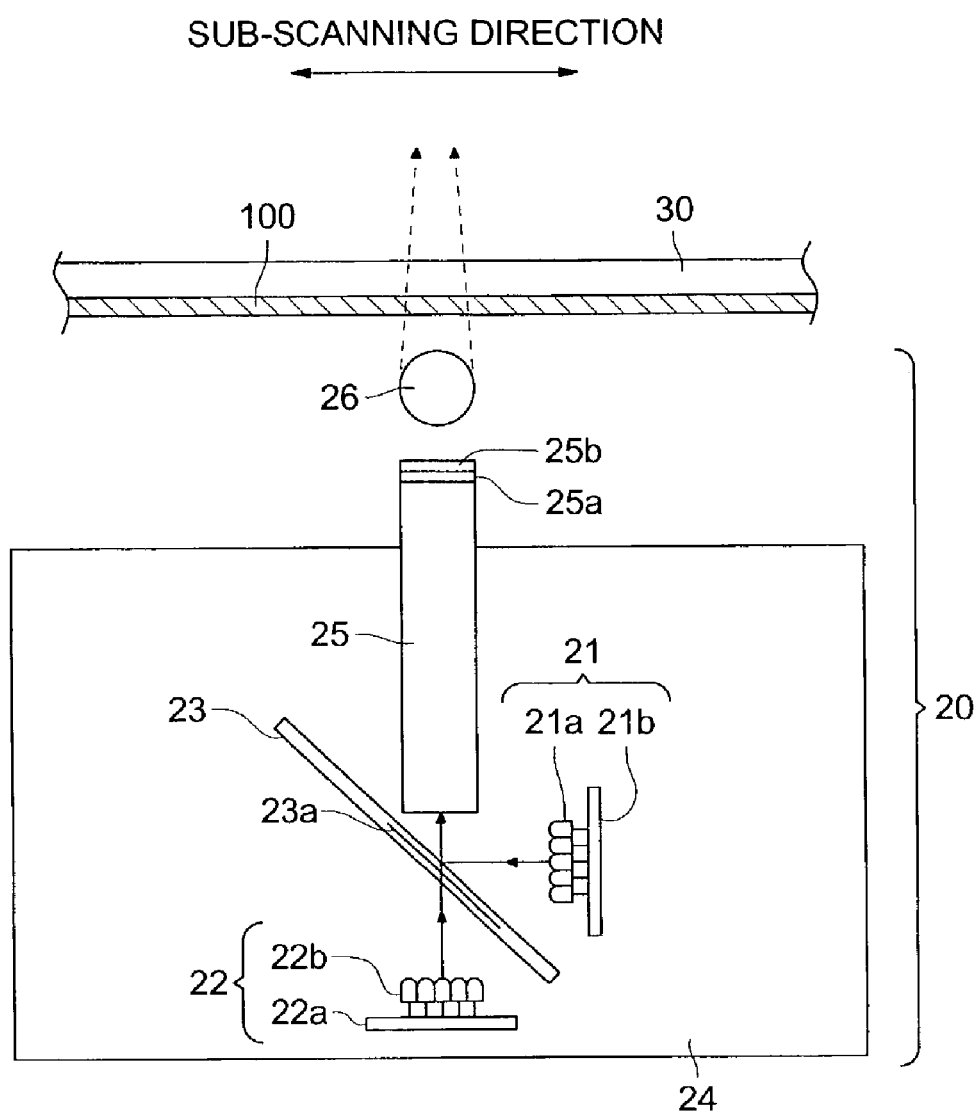

FIG. 10 is a sectional view taken on line III—III in FIG. 9.

Figure 11:
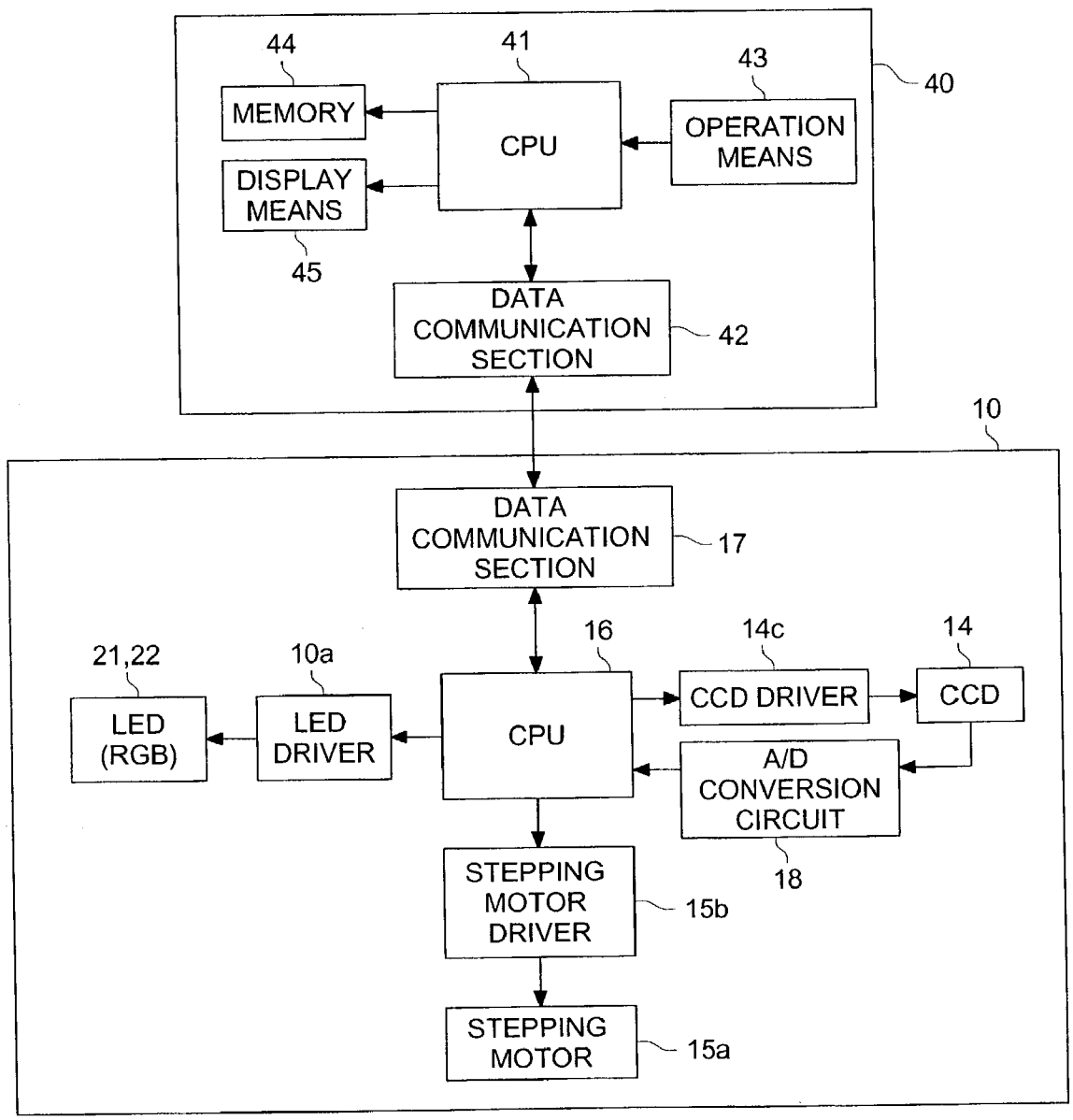

FIG. 11 is an illustration for illustrating an electric structure of the image reading apparatus relating to the second embodiment.

Figure 12:
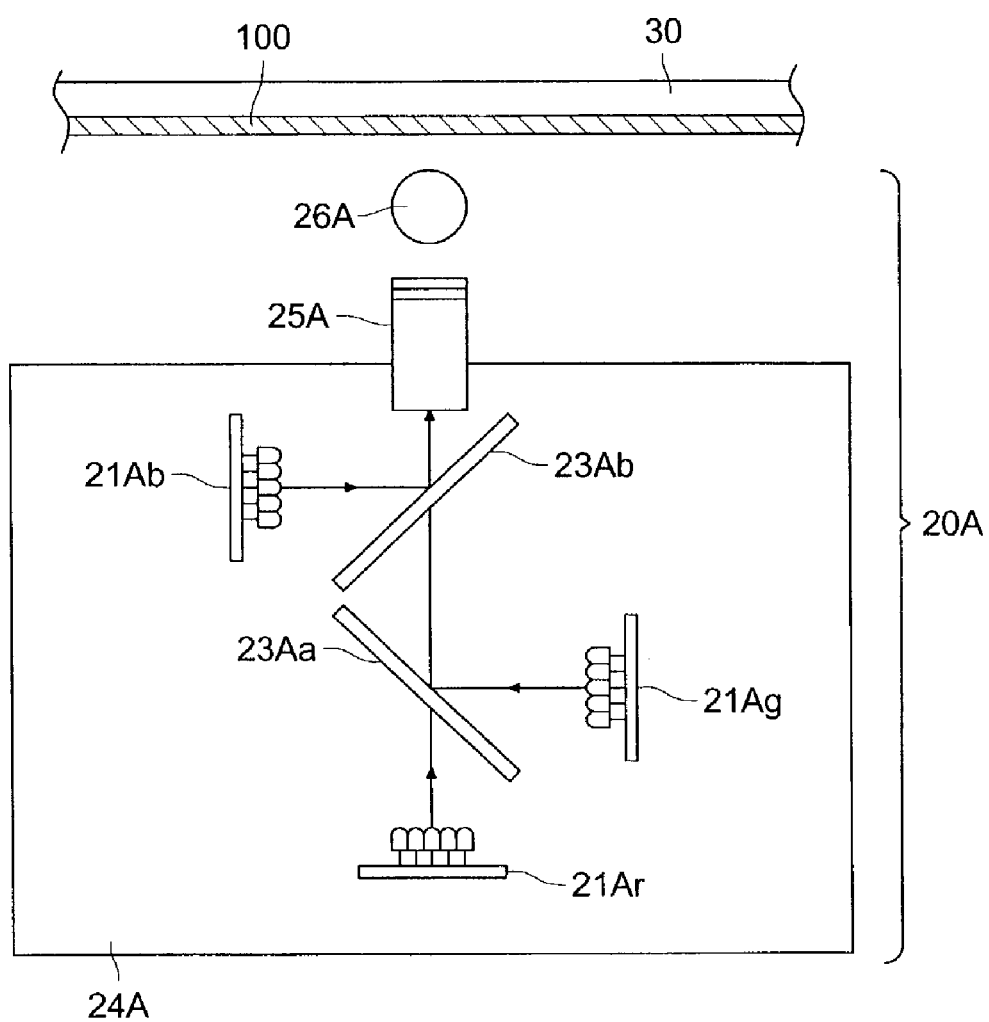

FIG. 12 is an illustration for illustrating a mechanical structure of a light-emitting mechanism housed in a film scanner of an image reading apparatus serving as a third embodiment to which the invention is applied.

EMBODIMENT IN BEST MODE FOR IMPLEMENTING THE INVENTION (First Embodiment)

The first embodiment of the invention will be explained in detail as follows, referring to the drawings. The structure will be explained first.

Figure 1:
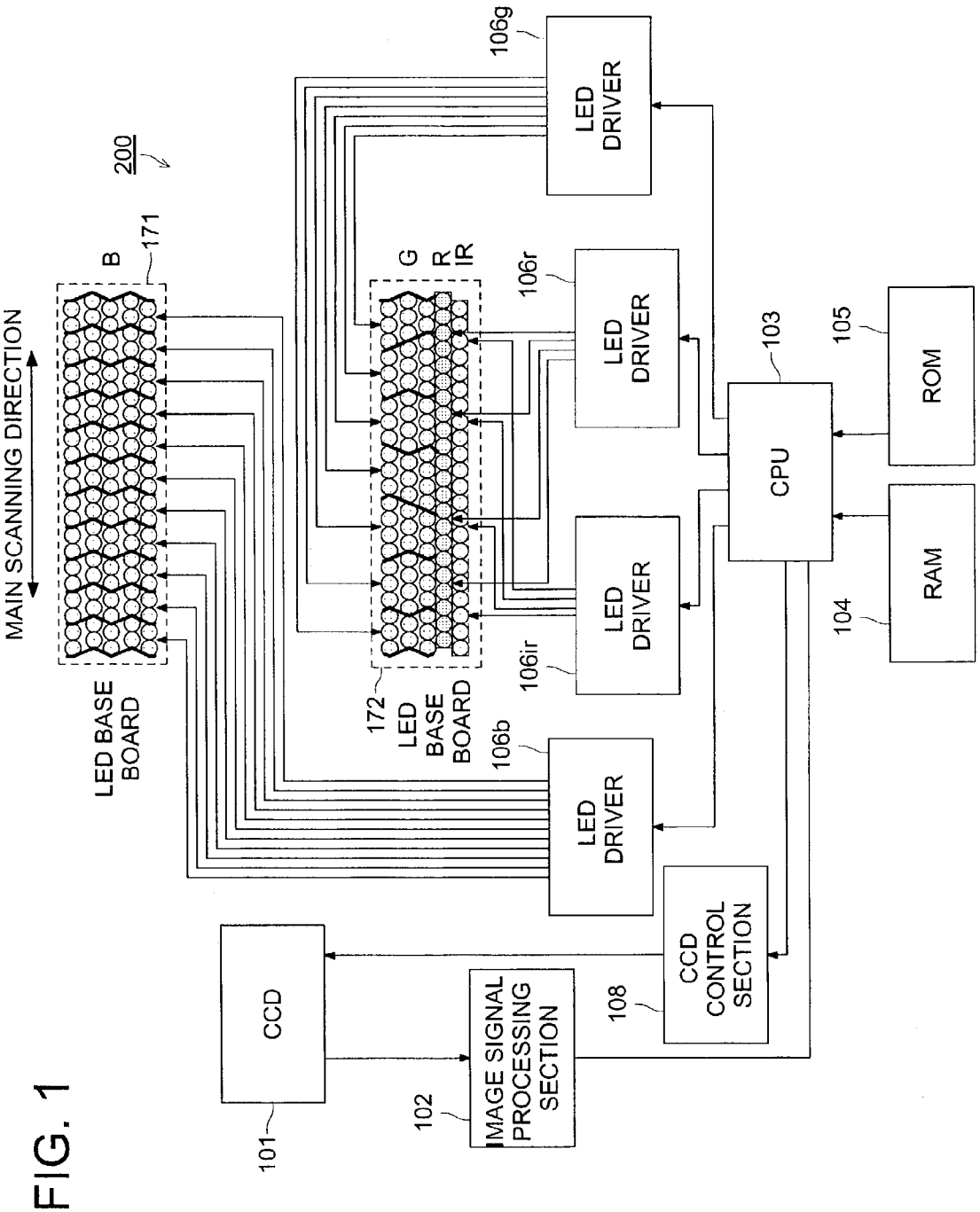
FIG. 1 is a block diagram showing an internal structure of image reading apparatus 200, as a first embodiment to which the invention is applied.

FIG. 1 is a block diagram showing an internal structure of image reading apparatus 200, as a first embodiment to which the invention is applied. As shown in FIG. 1, the image reading apparatus 200 is composed of CCD 101, image signal processing section 102, CPU 103, RAM 104, ROM 105, blue LED driver 106*b*, infrared LED driver 106*ir*, red LED driver 106*r*, green LED driver 106*g*, LED light sources 171 and 172 and CCD control section 108.

CCD 101 is a line sensor wherein several thousand light-receiving elements (pixels) are arranged to form a line, and it converts light signals converged on the line sensor by a lens (not shown) from light transmitted through a negative film into electric signals (analog signals). The analog signals are converted by an unillustrated A/D converter into digital signals, and are outputted to image signal processing section 102. Further, CCD 101 changes storing time of CCD 101 in accordance with storing time control signals inputted from CCD control section 108.

Image signal processing section 102 conducts various types of signal processing such as color balance adjustment or shading correction on digital image signals inputted from the A/D converter, and outputs the results of various signal processing to CPU 103.

Figure 2:
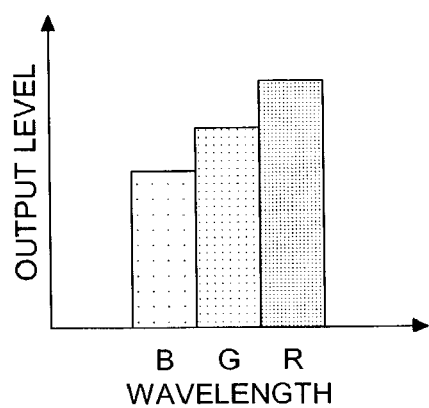
FIG. 2(*a*) and FIG. 2(*b*) show respectively an amount of light transmitted through the base (output level) before light intensity adjusting and an amount of light transmitted through the base after light intensity adjusting.
Figure 2:
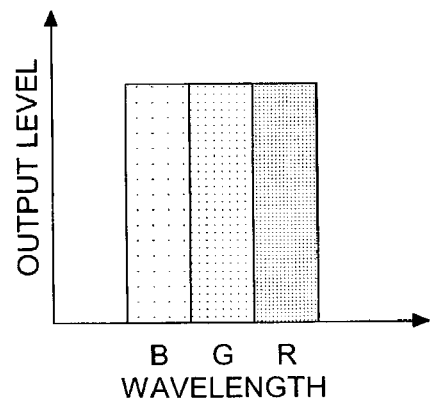

Image signal processing section 102 detects base density of a negative film to be read, in adjustment of color balance, and calculates light-amount values of respective colors (blue, green, red and infrared) so that an amount of transmitted light of each color of the negative film may be the same as others. For example, when an output level (base density) of an amount of light transmitted through the base of the negative film is different for each color (blue, green and red) as shown in FIG. 2(*a*), the image signal processing section 102 adjusts a light-amount so that an amount of transmitted light for each color may be the same as others as shown in FIG. 2(*b*). When the amount of transmitted light is extremely small, an image wherein a noise is remarkable is formed because of characteristics of CCD1. Therefore, in examples shown in FIG. 2(*a*) and FIG. 2(*b*), a light-amount of blue color component (B) and a light-amount of green color component (G) are increased, and light-amount values of respective colors are calculated so that light-amount of each color may be the same as others.

Figure 3:
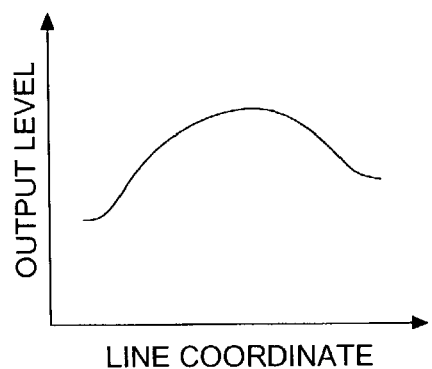
FIG. 3(*a*) and FIG. 3(*b*) show respectively an output level of CCD line sensor before conducting light intensity adjusting and an output level after conducting light intensity adjusting by shading correction.
Figure 3:
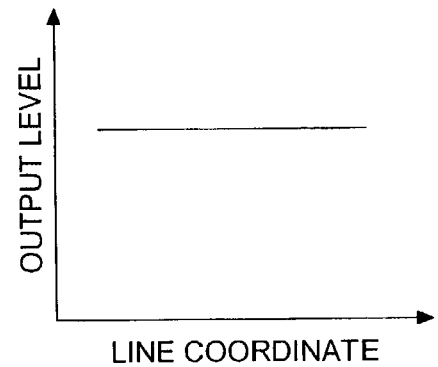

Image signal processing section 102 detects light-amount distribution (shading information of LED light source) on a line sensor of CCD 101, in shading correction, and calculates a light-amount correction value on the line sensor so that this light-amount distribution may be uniform (flat). For example, when light-amount distribution (output level) is uneven on the line sensor (line coordinate) as shown in FIG. 3(*a*), with respect to shading information of a light source, the image signal processing section 102 calculates a light-amount correction value on the line sensor so that the light-amount distribution may be uniform (flat) as shown in FIG. 3(*b*).

Incidentally, the image signal processing section 102 has functions as a density information detecting means in the scope of the claims and as a shading information detecting means.

CPU (Central Processing Unit) 103 conducts various types of control operations in accordance with the control program for an image reading apparatus stored in ROM 105.

To be concrete, CPU 103 adjusts an amount of light emitted by LED light source for each color, based on light-amount value data inputted from the image signal processing section 102, and outputs, to LED drivers 106*b*, 106*ir*, 106*r* and 106*g*, the driver driving signals for controlling an amount of light emitted from LED light source for each color, in accordance with the light-amount adjusting data.

Further, CPU 103 adjusts an amount of emitted light for each block formed through dividing in the main scanning direction of LED light sources 171 and 172, based on light-amount correction value data on the line sensor inputted from the image signal processing section 102, and outputs, to LED drivers 106*b*, 106*ir*, 106*r* and 106*g*, the driver driving signals for controlling an amount of emitted light for each block of LED light sources 171 and 172, in accordance with the light-amount adjusting data.

In information shown by the driver driving signal, there is specified a method of controlling a light-amount, in addition to a value of an amount of light to be emitted from each block of LED light sources 171 and 172. As a method of controlling a light-amount, electric current control that controls a light-amount by changing an electric current to be supplied to a light source and PWM (Pulse Width Modulation) control that controls a light-amount by changing flashing time for flashing operations of an LED light source.

In the electric current control, a light-amount is varied depending on a level of intensity of electric current supplied to LED light sources 171 and 172.

As shown in FIG. 4(*a*), the PWM control is control by pulse width modulation wherein the storing time of CCD 101 is made to be one cycle, and a height of a pulse represents a light-amount, H period represents lighting time of LED light source, and L period represents lights-out time. In the PWM control, an amount of light emitted from the LED light source is changed in accordance with a value of duty ((lighting time/storing time)×100). Namely, an amount of light emitted from the LED light source is adjusted by changing lighting time in one storing time. In the PWM control, the duty and a level of an output from CCD 101 are in the linear relationship.

Further, CPU 103 adjusts a level of an amount of light outputted from CCD 101 by outputting storing time control signals to CCD control section 108 and by changing storing time of CCD 101. For example, when a level of an amount of light does not reach the light-amount value calculated in the foregoing even when the duty is made to be 100%, it is possible to make the output level of CCD 101 to be high by lengthening the storing time of CCD 101 as shown in FIG. 4(*b*). Incidentally, as a method of controlling a light-amount, either one of the electric current control and the PWM control may be used, or, both of them may also be used in combination.

Further, CPU 103 adjusts a light-amount of LED light sources 171 and 172 under the image reading (scanning) and under the standby state other than an operating state for reading a document, and outputs, to LED drivers 106*b*, 106*ir*, 106*r* and 106*g*, the driver driving signals for controlling LED light sources 171 and 172 in accordance with the adjusted light-amount. To be concrete, CPU 103 does not turn of LED light sources completely but makes faint light to be emitted as shown in FIG. 5, for avoiding sudden changes of light-amount caused by sudden temperature rise in a moment to shift to image scanning from the standby state.

Incidentally, CPU 103 has functions as a light-amount adjusting means, an electric current control means, a pulse width modulation control means and a standby light-amount adjusting means, all in a range of the claims.

In FIG. 5, RAM (Random Access Memory) 104 develops a control program in an unillustrated program storage area in RAM 104 when CPU 103 conducts various processing programs stated above, and stores data produced when CPU 103 conducts various processing programs stated above in an unillustrated data storage area temporarily.

ROM (Read Only Memory) 105 stores in advance various types of control programs executed by CPU 103 and data used for various operations.

Blue LED driver 106*b* controls an amount of emitted light independently for each block formed by dividing in the main scanning direction in LED light source 171 (blue light source) as shown in FIG. 1, in accordance with driver driving signals inputted from CPU 103.

Red LED driver 106*ir* controls an amount of emitted light independently for each block formed by dividing in the main scanning direction in infrared (IR) area of LED light source 172 as shown in FIG. 1, in accordance with driver driving signals inputted from CPU 103. Red LED driver 106*r* controls an amount of emitted light independently for each block formed by dividing in the main scanning direction in red (R) area of LED light source 172 as shown in FIG. 1, in accordance with driver driving signals inputted from CPU 103. Green LED driver 106*g* controls an amount of emitted light independently for each block formed by dividing in the main scanning direction in green (G) area of LED light source 172 as shown in FIG. 1, in accordance with driver driving signals inputted from CPU 103.

In LED light source 171, light-emitting elements of blue LED (B) are arranged crosswise in a honeycomb pattern on LED base board as shown in FIG. 1, and the LED light source 171 is divided into blocks in the main scanning direction. Each light-emitting element is controlled for each block by the drive of blue LED driver 106*b*.

In LED light source 172, light-emitting elements of green LED (G), red LED (R) and (infrared LED (IR) are arranged in the main scanning direction on LED base board as shown in FIG. 1, and the LED light source 172 is divided into blocks in the main scanning direction, in the same way as in LED light source 171. Each light-emitting element of infrared LED, red LED and green LED is controlled for each block by the drive of green LED driver 106*g*.

CCD control section 108 controls storing time of CCD 101 in accordance with storing time control signals inputted from CPU 103.

Next, operations of the present embodiment will be explained.

Referring to the flow chart in FIG. 6, image reading processing conducted by image reading apparatus 200 of the present invention will be explained.

First, when measurement of shading information of LED light source is specified by an unillustrated operation key, prior to reading of images on a negative film, CPU 103 indicates emission of light of LED light sources 171 and 172 for each LED driver. After detecting light-amount distribution data (shading information of LED light source) on the line coordinate outputted from CCD 101 (step S1), image signal processing section 102 conducts shading correction for the light-amount distribution data, and stores the correction data in an unillustrated memory.

When a negative film is set on the image reading apparatus 200, and reading of the negative film (order processing) is specified from an operation key, CPU 103 indicates emission of light to the film under the same condition of light emission for each LED driver. After detecting base density of the negative film (step S2), the image signal processing section 102 calculates a light-amount value for each color based on the detected base density so that an amount of base-transmitted light for each color of the negative film may be the same as others.

CPU 103 adjusts an amount of light emitted from LED light source for each color based on light-amount value data for each color inputted from the image signal processing section 102, and adjusts independently an amount of emitted light for each block of LED light source based on light amount correction data by shading correction, and thereby, determines light intensity adjusting conditions for LED light source (step S3).

Next, CPU 103 indicates execution of pre-scanning for the negative film (step S4), and obtains average density of total images of the film by the pre-scanning operation. Then, CPU 103 judges whether the images on the film are under the overexposure (or under the super over exposure) or not (step S5).

In step S5, if the images on the film are under the overexposure (step S5; YES), CPU 103 outputs storing time control signals to CCD control section 108 so that the storing time of CCD 101 may be made longer than the present length (step S6).

Then, CPU 103 outputs driver drive signals for controlling an amount of emitted light for each color (for each channel) and for each block in the same channel, to LED drivers 106*b*, 106*ir*, 106*r* and 106*g*, according to the light intensity adjusting condition determined in step S3, to make regular scanning of the film to be started (step S7), and terminates the image reading processing. If the images on the film are judged to be under the normal exposure in step S5 (step S5; NO), CPU 103 makes regular scanning to be started immediately.

In the image reading apparatus 200 of the present embodiment, by conducting the light intensity adjusting for each color (for each channel) of LED light source in accordance with base density of a negative film to be read as stated above, it is possible to achieve optimizing of dynamic range of images to be read, and thereby, to secure color balance of images to be read.

Further, by conducting, in accordance with shading information of a light source, the light intensity adjusting for each block formed by dividing in the main scanning direction in the same color (same channel) of LED light source, it is possible to uniformalize an output level on the line coordinate of CCD 101, and to reduce unevenness of light-amount for images to be read.

Further, with respect to the PWM control, if it is used as a method to control a light-amount of LED light sources 171 and 172, because of the condition that the duty stated above and the level of the output from CCD 101 are in the linear relationship, and responsiveness is high, uniformity of the aforesaid output level is realized and an improvement of image quality of images read is achieved.

By virtue of the arrangement wherein light intensity adjusting can be switched both under scanning of a photographic film and under standby, it is possible to control deterioration of LED light source and to secure stability.

Incidentally, contents of the present embodiment are not limited to the aforesaid contents, and they may be modified properly within a range of scope and spirit of the invention.

(Second Embodiment)

The second embodiment in the invention will be explained in detail as follows, referring to the drawings. In the present embodiment, there will be explained an image reading apparatus used in a photographic image processing system that converts images obtained through photographing by a camera into digital image data.

The image reading apparatus of the present embodiment is composed of film scanner 10 representing a reading section and controller 40 which (will be described later and) is a control section that controls the film scanner 10. FIG. 8 is a schematic perspective view wherein the film scanner 10 is viewed obliquely from the lower part. FIG. 9 is an illustration for explaining the structure of a light-emitting mechanism housed in the film scanner 10, and FIG. 10 is a sectional view taken on line III—III in FIG. 9. FIG. 11 is an illustration for explaining an electric structure of the image reading apparatus in the present embodiment.

A mechanical structure of the film scanner 10 of the image reading apparatus of the present embodiment will be explained first, referring to FIGS. 8–10. The film scanner 10 is composed of light-emitting mechanism 20, a reading means that reads light that is emitted from the light-emitting mechanism 20 and is transmitted through document 100 and a conveyance means that makes it possible for document 100 to reciprocate for the light-emitting mechanism 20 and the reading means. Incidentally, in the present embodiment, a six-frame piece film is used ad document 100.

The light-emitting mechanism 20 has a function to irradiate document 100 on which image information is recorded with prescribed light. A mechanical structure of the light-emitting mechanism 20 will be explained as follows, referring to FIGS. 9 and 10.

The light-emitting mechanism 20 has therein first LED 21 representing B (blue) light source, second LED 22 representing G (green) light source, R (red) light source and Ir (infrared) light source, dichroic mirror 23 representing a light-mixing means that reflects light emitted from the first LED 21, then, transmits light emitted from the second LED 22 to mix both lights, and forms emergent light toward the piece film side, mirror tunnel 25 representing a light-guiding means that guides light mixed by the dichroic mirror 23 to the piece film side, and rod lens 26 representing a light-converging means that converges light emerging from the mirror tunnel 25 toward the piece film side.

The first LED 21 is a light source that emits B (blue) light having a wavelength of 420–470 nm, and is structured with a plurality of light-emitting elements arranged on base board 21a in a honeycomb pattern. The second LED 22 is a light source that emits G (green) light having a wavelength of 500–600 nm, R (red) light having a wavelength of 640–680 nm and infrared radiation. This second LED 22 is also structured with a plurality of light-emitting elements 22b arranged on base board 22a in a honeycomb pattern.

In the present embodiment, a directivity angle of each of light-emitting elements 21b and 22b which respectively constitute the first LED 21 and the second LED 22 is set to 30°. Further, a width of each of the first LED 21 and the second LED 22 is slightly longer than a width of document 100 so that document 100 may be irradiated totally.

The dichroic mirror 23 is a wavelength selecting optical member that selectively transmits or reflects light depending on its wavelength, and it has therein prescribed metal film 23a whose average transmittance for B (blue) light having a wavelength of 420–470 nm is 10% or less And average transmittance for light having a wavelength of 500 nm or more is 90% or more. Accordingly, it is possible for the dichroic mirror 23 to reflect blue light emitted from the first LED 21 and to transmit green light, red light and infrared light emitted from the second LED 22. Thus, it can form an emergent light toward the document 100 side by mixing reflected blue light and transmitted green light and red light.

Incidentally, the first LED 21, the second LED 22 and the dichroic mirror 23 are fixed by an unillustrated fixing member inside casing 24 in a form of a rectangular parallelepiped.

The mirror tunnel 25 is a light-guiding means that guides light mixed by the dichroic mirror 23 (hereinafter referred to as "mixed light") toward the piece film side. The mirror tunnel 25 can prevent a decline of an amount of mixed light by making the entering mixed light to be reflected totally in the mirror tunnel, and can make the mixed light to be uniform. The mirror tunnel 25 is in a form of a wide quadratic prism as shown in FIGS. 9 and 10, and its width is set to be substantially the same as that of document 100. Further, an area of an incident surface of light is set to be mostly the same as that of an emergent surface.

The mirror tunnel 25 is housed mostly in the casing 24 in a form of a rectangular parallelepiped, and it is fixed with a neighborhood of its top on the emergent surface projected to the document 100 side, as shown in FIGS. 9 and 10.

On the emergent surface of the mirror tunnel 25 (surface on the document 100 side), there are provided diffusing film 25a representing a light-diffusing means that diffuses light and Fresnel lens 25b representing a plate-type optical element that converges light.

The diffusing film 25a is a thin film with a thickness of 0.254 mm made of polycarbonate, and it has a function to diffuse and equalize mixed light entered the mirror tunnel 25 immediately before the mixed light emerges toward the document 100 side. A directivity angle of the diffusing film 25a is set to 5° or more.

Fresnel lens 25b has a function to converge light diffused and equalized by the diffusing film 25a. Namely, mixed light which has entered mirror tunnel 25 and is diffused and equalized by the diffusing film 25a is converged by the Fresnel lens 25b in the direction (main scanning direction) shown by an arrow with dotted line to emerge toward rod lens 26 (document 100 side).

The rod lens 26 shows a cylindrical shape as shown in FIGS. 9 and 10, and has a function as a light-converging means that converges light emerging from mirror tunnel 25 toward document 100. Namely, mixed light which has passed through mirror tunnel 25, diffusing film 25a and Fresnel lens 25b is made to emerge toward the document 100 side under the state wherein the mixed light is converged by rod lens 26 in the direction shown by an arrow with dotted line (sub-scanning direction).

In this case, a distance from an emergent surface of mirror tunnel 25 to rod lens 26 can be determined properly in accordance with an area of the emergent surface of the mirror tunnel 25 and with a diameter of the rod lens 26. In the present embodiment, a width of the mirror tunnel 25 and a diameter of the rod lens 26 are established to be 20 mm and a distance from the emergent surface of the mirror tunnel 25 to the rod lens 26 is established to be 15 mm.

Further, a distance from the emergent surface of the rod lens 26 to document 100 can be determined properly in accordance with a diameter of the rod lens 26, a light-amount of a light source (first LED 21 and second LED 22) and a type of the document. For example, a distance from an emergent surface of the rod lens to document 100 can be established to be within a range from 5 mm up to twice a diameter of the rod lens 26. In the present embodiment, a diameter of the rod lens 26 is set to 20 mm, and a distance from an emergent surface of the rod lens 26 to document 100 is set to 12 mm.

Next, a reading means will be explained. The reading means is one to read light which is emitted from light-emitting mechanism 20 and is transmitted through document 100. The reading means is composed of mirror 11 that reflects light which is emitted from light-emitting mechanism 20 and is transmitted through document 100, lens 12 that converges light reflected by the mirror 11, dichroic prism 13 that divides light signals converged by the lens 12 into R, G and B components and Ir component and CCD 14 that receives light signals divided by the dichroic prism 13 and converts them into electric signals.

The dichroic prism 13 functions so that it transmits only R, G and B components among optical signals entered and it reflects Ir component in the vertical direction (see FIG. 8). Further, in the present embodiment, first CCD 14a that receives color information corresponding to each of R, G and B and second CCD 14b that receives information relating to Ir are employed as CCD 14. The second CCD 14b functions to read R irradiation, G irradiation and B irradiation simultaneously each time the frame is advanced by one step by a stepping motor described later.

Next, a conveyance means will be explained. The conveyance means makes it possible for document 100 to reciprocate for light-emitting mechanism and a reading means. The conveyance means is a rack and pinion mechanism which is composed of pinion 15 provided in a main body of film scanner 10 and rack 31 provided on the side of film carrier 30 conveyed into a main body of film scanner 10 under the state where document 100 is attached. This rack and pinion mechanism is driven by a stepping motor described later, and it can advance document 100 by one step.

Next, an electric structure of an image reading apparatus relating to the present embodiment will be explained by the use of FIG. 11.

The film scanner 10 is composed of CPU 16, data communication section 17 that communicates with controller 40 which will be described later and an A/D conversion circuit 18 that converts image signals which are read from CCD 14 into digital image data. These data communication section 16 and A/D conversion circuit 18 are connected electrically with CPU 16. Incidentally, SCSI interface is employed as the data communication section 17, in the present embodiment.

Further, the film scanner 10 is composed of LED driver 20a that drives first LED 21 and second LED 22, CCD driver 14c that drives CCD 14, stepping motor 15a that drives a rack and pinion mechanism and stepping motor driver 15b that controls stepping motor 15a. These LED driver 20a, CCD driver 14a and stepping motor driver 15b are connected electrically with CPU 16.

The controller 40 is a control section that controls total film scanner 10 representing a reading section. The controller 40 is composed of CPU 41, data communication section (SCSI interface) 42 for exchanging data with film scanner 10, operation means (key board, mouse and others) 43 that gives various instructions to CPU 20, memory 44 that stores image data obtained through reading by film scanner 10 and display means (CRT) 45 that displays image data stored in the-memory 44.

In the image reading apparatus relating to the present embodiment, light-emitting mechanism 20 has therein first LED 21 that emits B (blue) light with a wavelength of 420–470 nm and second LED 22 that emits C (green) light with a wavelength of 500–600 nm and R (red) light with a wavelength of 640–680 nm, and spectrum distribution of the light emitted from these first LED 21 and second LED 22 is well-balanced from the short wavelength part to the long wavelength part. It is therefore possible to produce output of accurate image information.

Further, in the image reading apparatus relating to the present embodiment, it is possible to mix the light emitted from the first LED 21 and the second LED 22 by dichroic mirror 23 representing a light-mixing means, then, to converge in the sub-scanning direction by rod lens 26 representing a light-converging means (see FIG. 10), and to make the mixed light to enter document 100. Therefore, it is possible to control effectively a decline of a light-amount in the course from emission from the first LED 21 and the second LED 22 to entering document 100, because diffusion of light in the sub-scanning direction can be prevented.

Further, in the image reading apparatus relating to the present embodiment, it is possible to guide the light (mixed light) mixed by dichroic mirror 23 representing a light mixing means to rod lens 26 representing a light-converging means with a mirror tunnel 25 representing a light-guiding means. In the mirror tunnel 25, the mixed light can be reflected totally to be equalized. It is further possible to prevent that an amount of the mixed light in the course to arrive at rod lens 26 is lowered.

Further, in the image reading apparatus relating to the present embodiment, the light that is about to emerge from mirror tunnel 25 can be diffused more to be equalized and can be guided to rod lens 26, because diffusing film 25a representing a light-diffusing means is provided on the emergent surface side of the mirror tunnel 25.

Further, in the image reading apparatus relating to the present embodiment, the light that is about to emerge from mirror tunnel 25 can be converged in the main scanning direction (see FIG. 9) and can be guided to rod lens 26, because Fresnel lens 25b is provided on the emergent surface side of the mirror tunnel 25. Since diffusion of the light in the main scanning direction can be prevented by the Fresnel lens 25b, a decline of a light-amount in the course up to entering document 100 can be controlled more effectively.

Further, in the image reading apparatus relating to the present embodiment, document 100 is positioned to be away from an emergent surface of rod lens 26 representing a light-converging means by a specific distance (12 mm), and therefore, it is possible to suppress an influence of irregularity on the emergent surface of rod lens 26 and an influence of dust sticking to the emergent surface, while controlling effectively a decline of a light-amount in the course up to entering document 100.

(Third Embodiment)

In the present embodiment, the light source of the light-emitting mechanism and a structure of the light-mixing means in the second embodiment are changed, and other structures are substantially the same. So, explanation of the overlapped structures will be omitted.

FIG. 12 is an illustration for explaining a mechanical structure of light-emitting mechanism 20A housed in a film scanner of an image reading apparatus in the present embodiment. In the present embodiment, there are employed first LED 21Ag representing G (green) light source, second LED 21Ar representing R (red) light source and infrared light source and third LED 21Ab representing B (blue) light source, as a light source.

The first LED 21 Ag is a light source emitting G (green) light with wavelength 500–600 nm, the second LED 21 Ar is a light source emitting R (red) light with wavelength 640–680 nm and infrared light with wavelength 700 nm and the third LED 21 Ab is a light source emitting B (blue) light with wavelength 420–470 nm. In each of these first LED 21 Ag, second LED 21 Ar, and third LED 21 Ab, a plurality of light-emitting elements are arranged on a base board in a honeycomb pattern. The directivity angle of each light-emitting element constituting each of the first, second and third LEDs 21Ag, 21Ar and 21Ab is set to 15°.

In the present embodiment, first dichroic mirror 23Aa and second dichroic mirror 23Ab both representing two wavelength selecting optical members are employed as a light-mixing means.

Inside the first dichroic mirror 23Aa, there is provided an unillustrated prescribed metal film whose average transmittance for G (green) light with wavelength of 500–600 nm is 10% or less and that for light with wavelength of 640 nm or more is 90% or more. Further, inside the second dichroic mirror 23Ab, there is provided an unillustrated prescribed metal film whose average transmittance for B (blue) light with wavelength of 420–470 nm is 10% or less and that for light with wavelength of 500 nm or more is 90% or more.

Therefore, the first dichroic mirror 23 Aa can reflect green light emitted from the first LED 21 Ag and can transmit red light and infrared light emitted from the second LED 21 Ar. The second dichroic mirror 23 Ab can reflect blue light emitted from the third LED 21 Ab and can transmit green light emitted from the first LED 21 Ag and reflected on the first dichroic mirror 23 Aa, and red light and infrared light emitted from the second LED 21 Ar and transmitted through the first dichroic mirror 23 Aa. Thus, these green light, blue light and red light can be mixed to form an emitting light toward the document 100 side.

These first, second and third LEDs 21 Ag, 21 Ar and 21 Ab as well as the first and second dichroic mirrors 23 Aa and 23 Ab are fixed by an unillustrated fixing means on the inside of casing 24 in a form of a rectangular parallelepiped.

In the image reading apparatus relating to the present embodiment, light-emitting mechanism 20 has therein first LED 21 Ag that emits G (green) light with a wavelength of 500–600 nm, second LED 21 Ar that emits R (red) light with a wavelength of 640–680 nm, and third LED 21 Ab that emits B (blue) light with a wavelength of 420–470 nm and spectrum distribution of the light emitted from these first LED 21 AG, second LED 21 Ar and third LED 21 Ab is well-balanced from the short wavelength part to the long wavelength part. It is therefore possible to produce output of accurate image information.

Further, in the image reading apparatus relating to the present embodiment, it is possible to mix the light emitted from the first, second and third LEDs 21 Ag, 21 AR and 21Ab by the first and second dichroic mirrors 23 Aa and 23 Ab representing a light-mixing means, then, to converge in the sub-scanning direction by rod lens 26 A through mirror tunnel 25A and to make the mixed light to enter document 100. Therefore, it is possible to prevent light diffusion in the sub-scanning direction, and to control effectively a decline of a light-amount in the course from emission from the first, second and third LEDs 21 Ag, 21 Ar and 21 Ab to entering document 100.

Incidentally, though a mirror tunnel was used as a light-guiding means in the aforesaid embodiment, it is also possible to employ a tubular object that is made of transparent acrylic resin, in place of the mirror tunnel. Further, though a light-diffusing film was used as a light-diffusing means in the aforesaid embodiment, it is also possible to employ a milky plate, a light-diffusing plate, or a lens array, in place of the light-diffusing film. A light-diffusing means such as a light-diffusing film may either be provided on the incident surface side of a mirror tunnel or be provided on both an incident surface and an emergent surface.

The invention gives following effects.

(1) It is possible to secure color balance of images to be read, by adjusting independently a light-amount of each light source having a different wavelength, in accordance with base density of a document to be read.

(2) It is possible to reduce unevenness of a light-amount of images to be read by adjusting an amount of light emitted for each block divided in a light source having the same wavelength, based on shading information of the light source.

(3) It is possible to control light emission of each light source easily by control of an electric current.

(4) It is possible to achieve improvement of image quality relating to reading, by controlling light emission of each light source with pulse-width modulation.

(5) It is possible to retard deterioration of a light source and to secure stability, because a light-amount during a standby state other than a period of document reading has been made to be adjustable.

(6) It is possible to make a wavelength of light emitted from each light source to be distributed properly from the short wavelength side to the long wavelength side, because a light-emitting mechanism has a plurality of light sources.

(7) Rays of light emitted from a plurality of light sources can be mixed by a light-mixing means and can be made to enter a document after being converged by a light-converging means. It is therefore possible to prevent diffusion of rays of light emitted from a plurality of light sources, and therefore, to retard effectively a decline of a light-amount during a period from emission of light from a plurality of light sources up to entering a document, resulting in improvement of image quality of images to be read.

(8) It is possible to guide the light mixed by a light-mixing means (mixed light) toward a light-converging means by a light-guiding means. For example, therefore, it is possible to retard a decline of a light-amount for a period up to the moment when the mixed light arrives at a light-converging means, and to equalize the mixed light.

(9) Since a light-diffusing means is provided on the light-guiding means, it is possible to diffuse further the light that has entered a light-guiding means to equalize it, and to guide it the light-converging means.

(10) Since a plate-type optical element for converging light is provided on a light-guiding means, the light that has entered the light-guiding means can be converged preliminary, and it can be guided to a light converging means. Therefore, diffusion of the light can further be prevented, and a decline of a light-amount for a period up to the moment when the light enters a document can be retarded more effectively.

(11) Since an emergent surface of a rod lens (light-converging means) is positioned to be away from a document by a specific distance, it is possible to retard an influence of irregularity on the emergent surface of the rod lens (light-converging means) and an influence of dust sticking to the emergent surface, while retarding effectively a decline of a light-amount for a period up to the moment when the light enters a document.

What is claimed is:

1. An apparatus for reading an image recorded on a photographic film, said apparatus comprising:
a plurality of Led arrays, each of which comprises a plurality of LED elements and emits light having a wavelength different from wavelengths of light emitted by another one of the LED arrays;
an image-reading section to read said image by detecting light which is one of transmitted and reflected by said photographic film, said light being obtained by irradiating lights emitted from said plurality of LED arrays onto said photographic film;
a density information detecting section to detect density information corresponding to a base density of said photographic film; and
a light-amount adjusting section to independently adjust an amount of each of said lights emitted by said plurality of LED arrays based on said density information, when said image-reading section reads said image.

2. The apparatus of claim 1, wherein each of said LED arrays is divided into a plurality of blocks by grouping the LED elements thereof into the plurality of blocks, and said light-amount adjusting section adjusts an amount of light emitted by each of said blocks.

3. The apparatus of claim 2, further comprising:
a shading-information detecting section to detect shading-information with respect to each of said LED arrays;

wherein said light-amount adjusting section adjusts the amount of light for each of said blocks, based on said shading-information.

4. The apparatus of claim 1, further comprising an electronic-current controlling section to control each light emitting action of said LED arrays by controlling a supply of electronic currents to each of said LED arrays, in accordance with the adjusted amounts of said lights.

5. The apparatus of claim 1, further comprising a pulse-width-modulation controlling section to control each light emitting action of said LED arrays, via a pulse-width modulating method, in accordance with the adjusted amounts of said lights.

6. The apparatus of claim 5, wherein said pulse-width-modulation controlling section controls an output of a light-receiving element which receives the light which is one of transmitted and reflected by said photographic film, by changing a storing time of said light-receiving element.

7. The apparatus of claim 1, further comprising a standby light-amount adjusting section to adjust the amounts of said lights emitted by said plurality of LED arrays, during a standby state other than an operating state for reading said image.

8. A method for controlling an image reading apparatus that includes a plurality of LED arrays, each of which comprises a plurality of LED elements and emits light having a wavelength different from wavelengths of light emitted by another one of the LED arrays, to read an image recorded on a photographic film, said method comprising:
    irradiating lights emitted from said plurality of LED arrays onto said photographic film;
    reading said image by detecting light which is one of transmitted and reflected by said photographic film;
    detecting density information representing a base density of said photographic film; and
    independently adjusting an amount of said lights emitted by said plurality of LED arrays based on said density information, when reading said image.

9. The method of claim 8, wherein each of said LED arrays is divided into a plurality of blocks by grouping the LED elements thereof into the plurality of blocks, and an amount of light emitted by each of said blocks is adjusted when adjusting said amount of said lights.

10. The method of claim 9, further comprising:
    detecting shading-information with respect to each of said LED arrays;
    wherein the amount of light emitted by each of said blocks is independently adjusted for each of said blocks, based on said shading-information.

11. The method of claim 8, further comprising controlling each light emitting action of said LED arrays by controlling a supply of electronic currents to each of said LED arrays, in accordance with the adjusted amounts of said lights.

12. The method of claim 8, further comprising controlling each light emitting action of said LED arrays via a pulse-width modulating method, in accordance with the adjusted amounts of said lights.

13. The method of claim 12, wherein an output of a light-receiving element, which receives the light which is one of transmitted and reflected by said photographic film, is controlled by changing a storing time of said light-receiving element.

14. The method of claim 8, further comprising adjusting the amounts of said lights emitted by said plurality of LED arrays during a standby state other than an operating state for reading said image.

15. An apparatus for reading an image, said apparatus comprising:
    a light-emitting section to irradiate light onto a photographic film on which said image is recorded, said irradiated light being one of reflected and transmitted by said photographic film;
    an image-reading section to read said image by detecting the light which is one of transmitted and reflected by said photographic film; and
    a density information detecting section to detect density information corresponding to a base density of said photographic film;
    wherein said light-emitting section comprises:
        a plurality of LED arrays;
        a light-mixing device to mix lights emitted from said plurality of LED arrays, so as to form an emitting light including said mixed lights traveling in substantially a same direction; and
        a light-converging element to converge said emitting light into said light that is irradiated onto said photographic film; and
    wherein an amount of each of said lights emitted by said plurality of LED arrays is independently adjusted based on said density information, when the image-reading section reads said image.

16. The apparatus of claim 15, wherein said lights emitted by said plurality of LED arrays have a plurality of different wavelengths; and
    wherein said light-mixing device comprises a wavelength-selective optical member that selectively one of transmits and reflects said lights based on said wavelengths of said lights.

17. The apparatus of claim 15, wherein an angle of emission of each of said LED arrays is set at an angle in a range of 10°–40° with respect to a center direction of each of said LED arrays.

18. The apparatus of claim 15, wherein each of said LED arrays comprises a plurality of light-emitting elements arranged in a honeycomb pattern.

19. The apparatus of claim 15, wherein said light-emitting section further comprises a light-guiding member to guide said emitting light to said light-converging element.

20. The apparatus of claim 19, wherein said light-guiding member comprises a light-diffusing member.

21. The apparatus of claim 19, wherein said light=guiding member comprises a plate-type optical element for converging light.

22. The apparatus of claim 21, wherein said plate-type optical element comprises a Fresnel lens.

23. The apparatus of claim 15, wherein said light-converging element comprises a rod lens.

24. The apparatus of claim 23, wherein a distance between a light-emitting surface of said rod lens and said photographic film is at least 5 mm, and not greater than twice a diameter of said rod lens.

25. An apparatus for reading an image, said apparatus comprising:
    a light-emitting section to irradiate light onto a photographic film on which said image is recorded, said irradiated light being one of reflected and transmitted by said photographic film;
    an image-reading section to read said image by detecting the light which is one of transmitted and reflected by said photographic film;
    a density information detecting section to detect density information corresponding to a base density of said photographic film; and a light-amount adjusting section to adjust an amount of said light irradiated by said light-emitting section, when said image-reading section reads said image of said photographic film;

wherein said light-emitting section includes:
- a plurality of LED arrays, each of which comprises a plurality of LED elements and emits light having a wavelength different from wavelengths of light emitted by another one of the LED arrays;
- a light-mixing device to mix said lights emitted from said plurality of LED arrays, so as to form an emitting light including said mixed lights traveling in substantially a same direction; and
- a light-converging element to converge said emitting light into said light that is irradiated onto said photographic film; and wherein said light-amount adjusting section independently adjusts an amount of each of said lights emitted by said plurality of LED arrays based on said density information.

* * * * *